(12) United States Patent
Chatterjee et al.

(10) Patent No.: US 7,932,175 B2
(45) Date of Patent: Apr. 26, 2011

(54) METHOD TO FORM A VIA

(75) Inventors: Ritwik Chatterjee, Austin, TX (US);
Eddie Acosta, Martindale, TX (US);
Sam S. Garcia, Austin, TX (US);
Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 568 days.

(21) Appl. No.: 11/807,745

(22) Filed: May 29, 2007

(65) Prior Publication Data
US 2008/0299759 A1   Dec. 4, 2008

(51) Int. Cl.
*H01L 21/4763* (2006.01)
(52) U.S. Cl. ............... 438/623; 438/640; 257/E21.496
(58) Field of Classification Search .......... 438/640, 438/643, 637, 638, 622, 623, 667
See application file for complete search history.

(56) References Cited

U.S. PATENT DOCUMENTS

| 5,998,292 | A  | 12/1999 | Black et al. |
| 6,908,856 | B2 | 6/2005  | Beyne et al. |
| 2006/0046432 | A1 | 3/2006 | Sankarapillai et al. |
| 2007/0048994 | A1* | 3/2007 | Tuttle ........................ 438/597 |
| 2008/0050911 | A1* | 2/2008 | Borthakur ................. 438/622 |

OTHER PUBLICATIONS

Sparks, Terry G. and Jones, Robert E.; "Conductive VIA Formation Utilizing Electroplating"; filed Feb. 27, 2007; U.S. Appl. No. 11/679,512; 17 pages.
Ruythooren, W. et al.; "Via technology for 3D wafer stacking"; IMEC, Belgium 2006; 31 pages.

* cited by examiner

*Primary Examiner* — Chuong A Luu
*Assistant Examiner* — Nga Doan
(74) *Attorney, Agent, or Firm* — Fortkort & Houston P.C.; John A. Fortkort

(57) ABSTRACT

A method for forming a via, comprising (a) providing a structure comprising a mask (210) disposed on a semiconductor substrate (203), wherein the structure has an opening (215) defined therein which extends through the mask and into the substrate, and wherein the mask comprises a first electrically conductive layer; (b) depositing a second electrically conductive layer (219) such that the second conductive layer is in electrical contact with the first conductive layer, the second conductive layer having a first portion which extends over the surfaces of the opening and a second portion which extends over a portion of the mask adjacent to the opening; (c) removing the second portion of the second conductive layer; and (d) depositing a first metal (221) over the first portion of the second conductive layer.

36 Claims, 3 Drawing Sheets

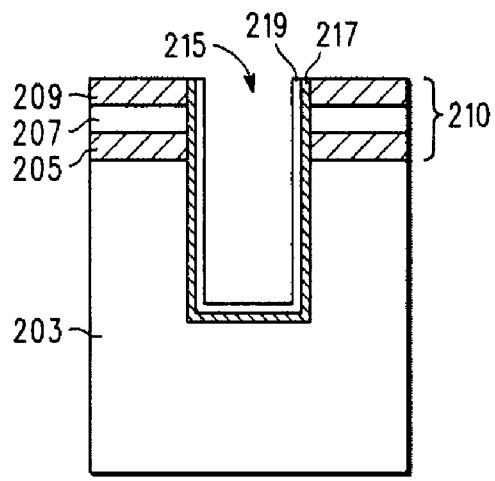
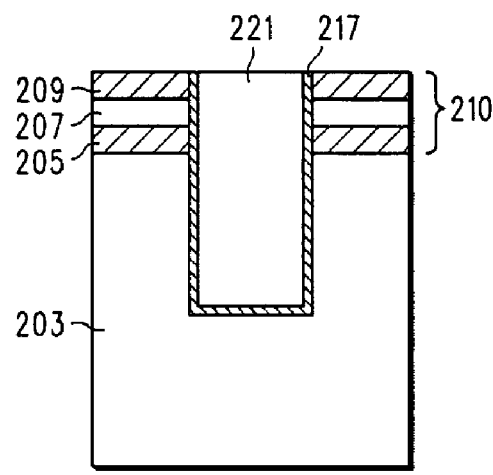
*FIG. 10*   *FIG. 11*
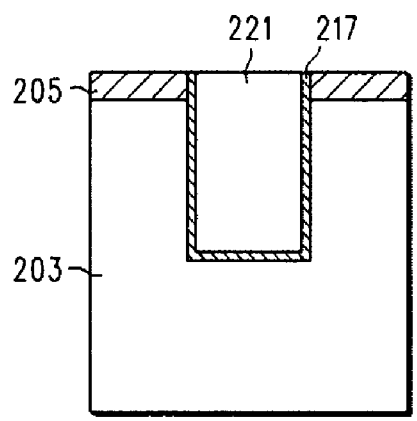
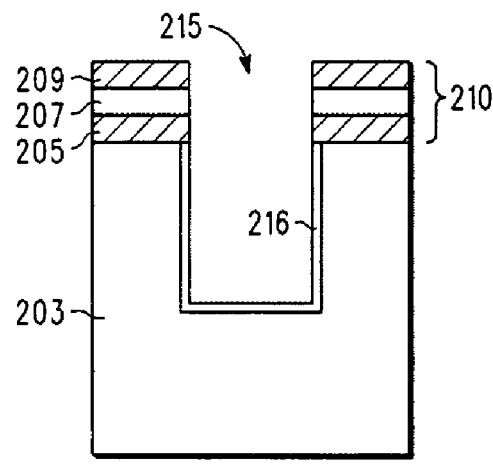
*FIG. 12*   *FIG. 13*
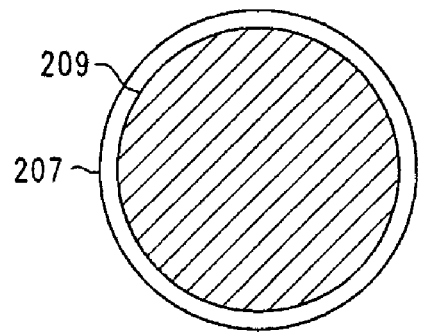
*FIG. 14*

METHOD TO FORM A VIA

FIELD OF THE DISCLOSURE

The present disclosure relates generally to semiconductor fabrication processes, and more particularly to methods for forming vias in semiconductor devices.

BACKGROUND OF THE DISCLOSURE

As semiconductor processing technology approaches the limits of traditional CMOS scaling, process integration has become increasingly challenging, and has resulted in diminished rates of performance improvement. Consequently, there is currently considerable interest in the art for chip package stacking solutions, including "system in package" (SiP) and "package on package" (PoP) technologies. Additional performance enhancements and reduced form factors can be realized with the use of three-dimensional integration. Through semiconductor vias (TSVs) are an important key to solutions of this type, since they enable three-dimensional stacking and integration of semiconductor devices.

Frequently, three-dimensional integration involves the face-to-face attachment of die, which necessitates the creation of I/O through die substrates. Typically, this is accomplished by forming deep TSVs through the die, filling the vias to form interconnects, and utilizing solder joints to attach the stacked 3D die to packaged substrates. However, while various methods exist in the art for filling vias, the application of these methods to filling deep TSVs has proven to be less than satisfactory.

In particular, and in comparison to standard interconnect vias, these deep TSVs are very difficult to fill with metal due to their high aspect ratios and the sheer volume of metal required. Thus, electroless processes for plating vias can be slow when applied to TSVs due to the relatively large volumes of metal required. Electroplating methods offer faster via fill and, in many applications, produce a fill of superior quality. However, these methods, in the form in which they are typically implemented, often produce a large metal overburden which can generate considerable stresses on the wafer. Moreover, such an overburden may require extended chemical mechanical polishing (CMP) to remove.

BRIEF DESCRIPTION OF THE DRAWINGS

FIG. 10 is an illustration of a step in a first particular, non-limiting embodiment of a process for making a via in accordance with the teachings herein;

FIG. 11 is an illustration of a step in a first particular, non-limiting embodiment of a process for making a via in accordance with the teachings herein; and FIG. 12 is an illustration of a step in a first particular, non-limiting embodiment of a process for making a via in accordance with the teachings herein.

FIG. 13 is an illustration of a step in a second particular, non-limiting embodiment of a process for making a via in accordance with the teachings herein.

FIG. 14 is a top view of a wafer in which an edge bead etch has been performed to allow electrical contact for electroplating.

DETAILED DESCRIPTION

Figure 1:
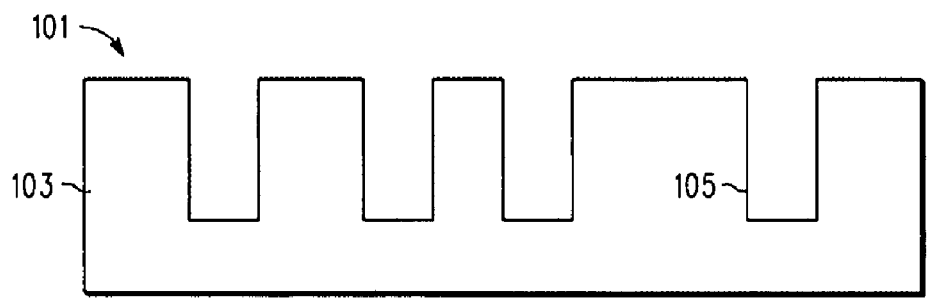
FIG. 1 is an illustration of a step in a prior art process for making a via.

In one aspect, a method for making a semiconductor device is provided, comprising (a) providing a structure comprising a mask disposed on a semiconductor substrate, wherein the structure has an opening defined therein which extends through the mask and into the substrate, and wherein the mask comprises a first electrically conductive layer; (b) depositing a second electrically conductive layer such that the second conductive layer is in electrical contact with the first conductive layer, the second conductive layer having a first portion which extends over the surfaces of the opening and a second portion which extends over a portion of the mask adjacent to the opening; (c) removing the second portion of the second conductive layer; and (d) depositing a first metal over the first portion of the second conductive layer.

In another aspect, a method for making a semiconductor device is provided which comprises (a) providing a semiconductor substrate; (b) creating a mask over the substrate, the mask comprising a metal layer disposed between first and second dielectric layers and having an opening defined therein which exposes a portion of the substrate and a portion of the metal layer; (c) etching the exposed portion of the substrate to create a via therein; (d) depositing an electrically conductive barrier layer over the surfaces of the via; (e) depositing a metal seed layer over the barrier layer; (f) removing the metal seed layer from the portion of the substrate adjacent to the via; and (g) filling the via with an electroplating process.

It has now been found that electroplated via fill may be achieved with minimal overburden, and with minimal additional processing, by utilizing a metal seed layer which is confined to the surfaces of the via to be filled. This may be accomplished, for example, by (a) using a mask containing a metal layer to form the via, (b) depositing a seed layer over the structure such that the seed layer is in contact with the metal layer and extends over the surfaces of the via, and (c) removing the portion of the seed layer external to the via, as by chemical mechanical polishing (CMP), etching, or by other suitable means. The metal layer in the mask, which is in electrical contact with the seed layer, may then be utilized as a conductive element in the electroplating process. Moreover, since the metal seed layer is confined to the surfaces of the via, the interconnect metal will only plate (or be deposited) within the via, thus minimizing any subsequent CMP and reducing or eliminating metal overburden and the associated stress it places on the wafer.

This approach is further advantageous in that the mask used to form the via is self-aligned and hence requires only a single patterning step, unlike some photoresist methods known to the art. Moreover, in some embodiments in accordance with the teachings herein, the metal seed layer may be deposited over a dielectric layer and, after the portion of the seed metal layer on the top surface of the wafer is removed, the dielectric layer may be utilized as a portion of a subsequently defined interlayer dielectric (ILD).

The devices and methodologies disclosed herein may be further understood in the context of the prior art process depicted in FIGS. 1-5. In the methodology depicted therein, a semiconductor structure 101 is provided which comprises a semiconductor wafer 103 having a plurality of vias 105 defined therein. The vias 105 are created with the use of a mask (not shown) which is patterned on the semiconductor wafer 103. After the mask is defined, the vias 105 are etched into the semiconductor wafer 103 with a suitable etchant.

Figure 2:
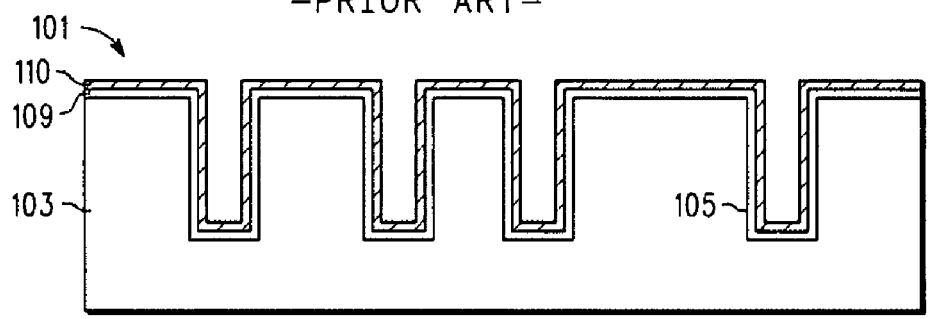
FIG. 2 is an illustration of a step in a prior art process for making a via.

Once the vias 105 are formed and the mask is removed, a dielectric layer 109 is deposited over the structure as shown in FIG. 2 so as to cover the sidewalls and bottom of the vias 105. A barrier layer 110 is then deposited over the dielectric layer 109.

Figure 3:
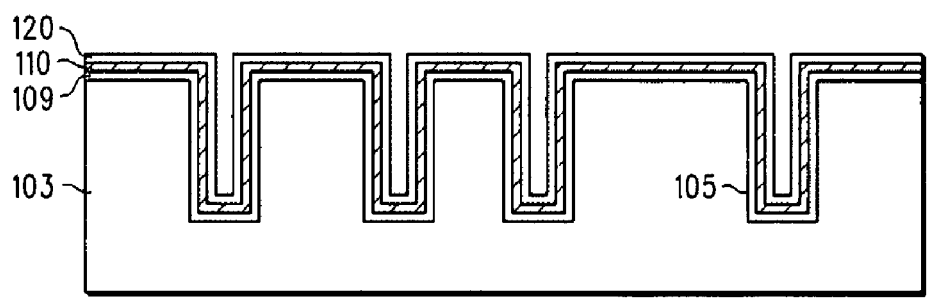
FIG. 3 is an illustration of a step in a prior art process for making a via.
Figure 4:
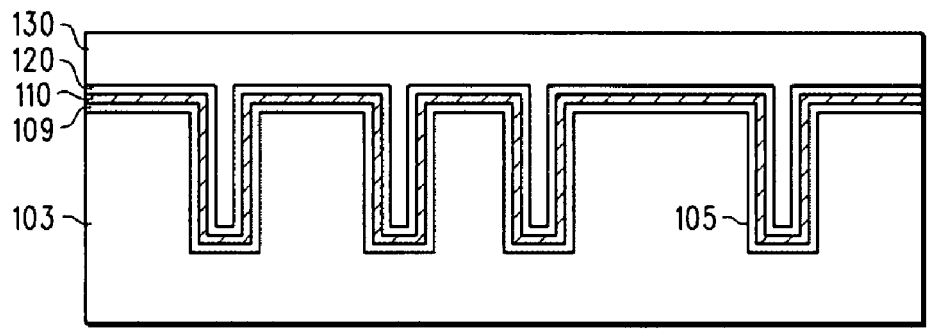
FIG. 4 is an illustration of a step in a prior art process for making a via.
Figure 5:
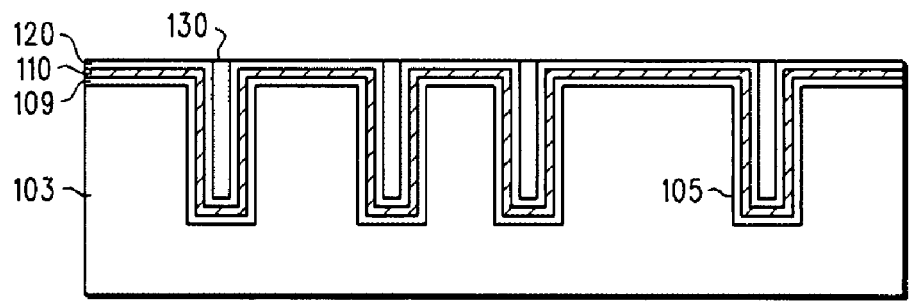
FIG. 5 is an illustration of a step in a prior art process for making a via.

As shown in FIG. 3, a metal seed layer 120 is then deposited over the barrier layer 110. The vias 105 are then filled through electroplating to form interconnects as shown in FIG. 4, although similar methods are also known in the art in which the vias 105 may be filled by an electroless process. The structure is then subjected to CMP as shown in FIG. 5 to remove the metal overburden.

While the process of FIGS. 1-5 may have some advantages, it also suffers from some notable infirmities. In particular, if an electroplating method is used to fill the via in this process, the metal seed layer must be formed not only over the surfaces of the via, but also over the surface of the substrate in which the via is formed so that the metal seed layer will be in electrical contact with a current source. Consequently, the interconnect metal will grow on both of these surfaces. As a result, a substantial metal overburden will be created which may exert stress on the surfaces of the wafer, and which may require extended CMP for its removal.

Figure 6:
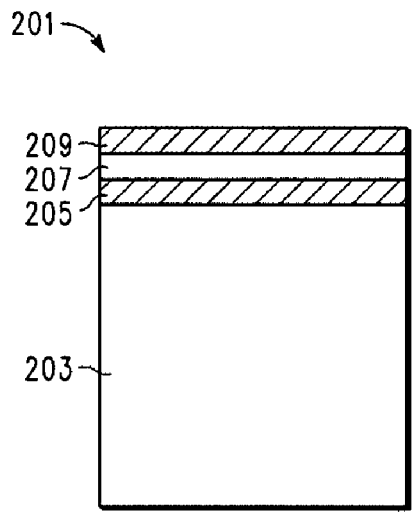
FIG. 6 is an illustration of a step in a first particular, non-limiting embodiment of a process for making a via in accordance with the teachings herein.

FIGS. 6-12 illustrate a first particular, non-limiting embodiment of a process in accordance with the teachings herein. With reference to FIG. 6, a structure 201 is provided which comprises a semiconductor substrate 203 upon which is disposed a hard mask stack 210. The hard mask stack 210 includes a metal layer 207 which is disposed between first 205 and second 209 dielectric layers.

The semiconductor substrate 203 is preferably single crystal silicon, but may also comprise various other semiconductor materials including, but not limited to, Si, Ge, SiGe, GaAs, GaP, InAs, and InP. Moreover, while semiconductor substrate 203 is shown as a single layer, it will be appreciated that the semiconductor substrate 203 may include multiple layers of the same or different composition and/or crystal structure.

The metal layer 207 may comprise, for example, titanium, titanium nitride, chromium, nickel, Cu or various combinations or sub-combinations of the foregoing. The materials of the first 205 and second 209 dielectric layers may be the same or different, and may comprise, for example, tetraethylorthosilicate (TEOS), diamond-like carbon, silicon oxide, silicon nitride, aluminum oxide, or the like. Preferably, however, both of the first 205 and second 209 dielectric layers comprise TEOS.

Figure 7:
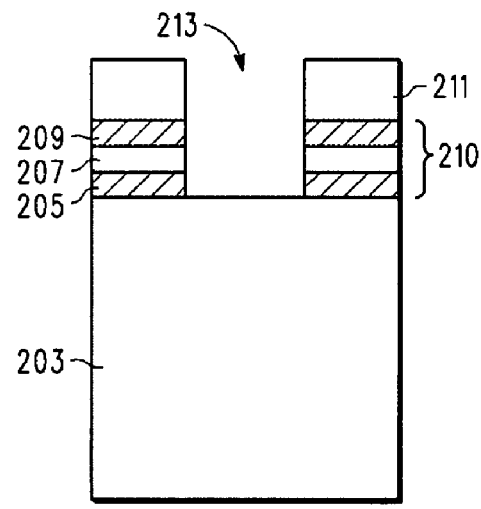
FIG. 7 is an illustration of a step in a first particular, non-limiting embodiment of a process for making a via in accordance with the teachings herein.

As shown in FIG. 7, a layer of a suitable photoresist 211 is then deposited over the structure 201 of FIG. 6 and is suitably patterned to define an opening therein. The exposed portion of the hard mask 210 is then etched with a suitable first etch to create an opening 213 therein which exposes a portion of the semiconductor substrate 203. This first etch may be a wet etch or a dry plasma etch. It may also be a multi-part etch which utilizes one or more steps to individually etch the second (top) dielectric 209 layer, the metal layer 207, and the first (bottom) dielectric layer 205. For example, either or both of the first 205 and second 209 dielectric layers may be etched in a reactive ion etching (RIE) chamber with chemistries which may be based on $CF_4$, $CHF_3$, $C_2F_6$, $C_3F_8$, $C_4F_8$, $SF_6$, $NF_3$, $C_4F_6$, $C_5F_8$, or HF (or various combinations or subcombinations thereof), and the sandwiched metal layer 207 may be etched in the same or different RIE chamber with etchants containing F, Cl, or Br.

Figure 8:
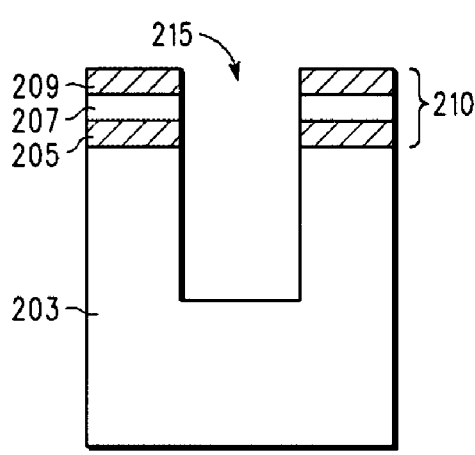
FIG. 8 is an illustration of a step in a first particular, non-limiting embodiment of a process for making a via in accordance with the teachings herein.

As shown in FIG. 8, a second etch, which may be the same as, or different from, the first etch, is utilized to form a via 215 in the semiconductor substrate 203. This may be achieved using a suitable wet or dry etch. Dry etching techniques which are suitable for this purpose include reactive ion etching (RIE), chemical dry etching, ion beam etching, or plasma etching. Preferably, the etch utilized has a high selectivity towards the semiconductor substrate 203. Suitable dry etches may be based on $CF_4$, $SF_6$, $NF_3$, $CHF_3$, $C_4F_8$, $CHCl_3$, $O_2$, $Cl_2$, $Br_2$, and various combinations or sub-combinations thereof. Suitable wet etches include, but are not limited to, HF, NaOH, KOH, $H_2O_2$, ethylene diamine, and ethanolamine.

If, after both etch processes, the metal layer 207 is laterally recessed compared to the first 205 and second 209 dielectric layers, then a dielectric lateral recess etch may be utilized to ensure that the metal layer 207 protrudes laterally relative to the first 205 and second 209 dielectric layers. Such protrusion may be useful for ensuring good electrical connection for the subsequent electroplating process.

Figure 9:
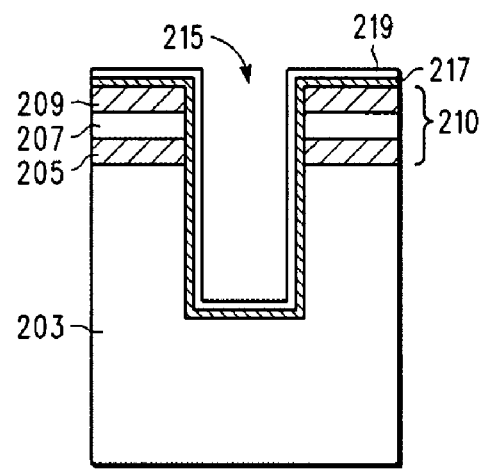
FIG. 9 is an illustration of a step in a first particular, non-limiting embodiment of a process for making a via in accordance with the teachings herein.

After the via 215 is etched to the proper depth, a conductive barrier layer 217 and seed metal layer 219 are deposited over the surfaces of the via 215 as shown in FIG. 9. The conductive barrier layer 217 and the seed metal layer 219 are deposited such that they are in electrical contact with the metal layer 207 embedded in the hard mask 210.

Referring now to FIG. 10, the structure is subjected to chemical mechanical polishing (CMP) such that the portions of the barrier layer 217 and the seed metal layer 219 which are disposed on the horizontal surface of the hard mask 210 adjacent to the via 215 are removed.

To enable electroplating of the via 215, electrical contact must be made to the metal layer 207 in the middle of the hard mask stack 210, so that electrical contact may in turn be made to the conductive barrier layer 217 and the seed metal layer 219 (that is, so that metal layer 207 may be used as an electrically conductive element for electroplating). In some embodiments, as where the first 205 and second 209 dielectric layers are deposited in a clamped system, such a contact may already exist. In other embodiments, an edge bead removal or etch can be performed for this purpose as depicted in FIG. 14 to remove the top dielectric 209 relative to the underlying metal 207. This etched region or edge exclusion region has a width which is preferably within the range of about 1 mm to about 10 mm and more preferably within the range of about 2 to about 5 mm, and which is most preferably about 3 mm. The etch used to remove the second (top) dielectric layer 209 may be based, for example, on phosphoric acid or HF, or may be a buffered oxide etch (BOE).

As shown in FIG. 11, the via 215 is then filled with a suitable metal 221. Possible metals which may be used for this purpose include, but are not limited to, Cu, Cr, Al, Ni, In and Au and various alloys thereof. The metal 221 is preferably deposited through a suitable electroplating process, although in some applications, an electroless process may be used instead. The electroplating process and tooling will deliver the current to drive the electroplating reaction via the edge region where the metal layer 207 of the hardmask stack 210 is exposed (or, as the case may be, through the clamped system). In addition, a sealed plating ring connection to the wafer is preferred where the connection to the wafer or the exposed metal layer 207 is not in contact with the plating bath, since this will prevent plating in the edge region where the metal layer 207 is exposed. The structure is then subjected to CMP to remove any metal overburden which may have formed.

Referring now to FIG. 12, the second dielectric layer 209 and the metal layer 207 are removed through etching or by CMP. Although the first dielectric layer 205 may also be removed by either of these processes, preferably, either process stops on the first dielectric layer 205. Since TSVs will typically be constructed just prior to interconnect processing, the first dielectric layer 205 may then be incorporated into the interlayer dielectric (ILD).

The structure depicted in FIG. 12 may then be subjected to additional processes as are known to the art. These may include, but are not limited to, the use of CMP on the backside of the die to expose the metal 221 in the via 215, the formation of various interconnects, the formation of backside contacts, and other such processing steps as are known to the art.

As shown in FIG. 13, in one possible variation of the foregoing embodiment, after the multi-layer hard mask 210 is patterned, an optional plasma nitridation step may be performed to form an insulating silicon nitride film 216. This step may be required if insulation between the final through via and the substrate 203 is desired. The feed gas for the nitridation step may be ammonia, nitrogen, hydrogen, or combinations thereof.

It will be appreciated from the foregoing description that the methodology of FIGS. 6-12 avoids or minimizes overburden, since the metal seed layer is limited to the surfaces of the via 215 prior to electroplating. The seed metal layer 219 may be limited in this manner without adversely affecting the electroplating process because the mask utilized to define the via 215 has a conductive metal layer 207 incorporated therein. This conductive metal layer 207 is in electrical contact with the metal seed layer 219, and may be brought into contact with a current source for plating. By contrast, in the methodology of FIGS. 1-5, no such mask is provided. Hence, if seeded electroplating is utilized to fill the vias therein, the metal seed layer must extend across the surface of the substrate adjacent to the via, and will therefore contribute to the formation of overburden.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims,

What is claimed is:

1. A method for making a semiconductor device, comprising:
    providing a structure comprising a mask disposed on a semiconductor substrate, wherein the structure has an opening defined therein which extends through the mask and into the substrate, and wherein the mask comprises a first electrically conductive layer sandwiched between first and second dielectric layers, and wherein the first electrically conductive layer, the first dielectric layer and the second dielectric layer are coextensive;
    depositing a second electrically conductive layer such that the second conductive layer is in electrical contact with the first conductive layer, the second conductive layer having a first portion which extends over the surfaces of the opening and a second portion which extends over a portion of the mask adjacent to the opening;
    removing the second portion of the second conductive layer; and
    depositing a first metal over the first portion of the second conductive layer.

2. The method of claim 1, wherein the second conductive layer comprises a metal seed layer.

3. The method of claim 2, further comprising forming a barrier layer having a first portion which extends over the surfaces of the opening and a second portion which extends over a portion of the mask adjacent to the opening, wherein the barrier layer is in electrical contact with the first conductive layer, and wherein the step of removing the second portion of the second conductive layer also removes the second portion of the barrier layer.

4. The method of claim 3, wherein the seed layer is deposited over the barrier layer.

5. The method of claim 4, wherein the barrier layer is a metal layer.

6. The method of claim 2, wherein the seed layer comprises copper, and wherein the first metal comprises copper.

7. The method of claim 1, wherein the first and second conductive layers are metal layers.

8. The method of claim 1, wherein the second portion of the second conductive layer is removed from the portion of the mask adjacent to the opening through chemical mechanical polishing (CMP).

9. The method of claim 1, wherein the mask comprises a first dielectric layer disposed between the first conductive layer and the substrate.

10. The method of claim 9, wherein the mask further comprises a second dielectric layer, and wherein the layer is disposed between the first and second dielectric layers.

11. The method of claim 10, wherein the first and second dielectric layers comprise tetraethylorthosilicate (TEOS).

12. The method of claim 1 wherein, prior to deposition of the second conductive layer, a dielectric layer is formed over the surfaces of the opening.

13. The method of claim 12, wherein the dielectric layer is formed by a plasma nitridation step.

14. The method of claim 1, wherein the first metal is deposited by electrochemical deposition.

15. The method of claim 1, wherein the semiconductor substrate is a wafer, and wherein the first conductive layer is disposed between first and second dielectric layers.

16. The method of claim 15, wherein the first metal is deposited by electrochemical deposition, and wherein at least one of the first and second dielectric layers is removed from the edge of the wafer by etching prior to the electrochemical deposition.

17. The method of claim 1, wherein the opening is a through semiconductor via (TSV).

18. The method of claim 1, wherein said first portion and said second portion of said second conductive layer are adjoining.

19. The method of claim 1 wherein, after removing the second portion of the second conductive layer, the second conductive layer extends only over the surfaces of the opening.

20. The method of claim 1, wherein said second portion of said second conductive layer extends to the edge of said opening.

21. A method for making a semiconductor device, comprising:
- providing a semiconductor substrate having a layer stack disposed thereon which comprises a first electrically conductive layer sandwiched between first and second dielectric layers;
- patterning the layer stack so as to form a first opening therein which exposes a portion of the substrate;
- using the patterned layer stack as a first mask to etch the substrate, thus forming a second opening which includes the first opening and which extends into the substrate;
- depositing a second electrically conductive layer such that the second conductive layer is in electrical contact with the first electrically conductive layer, wherein the second electrically conductive layer has a first portion that extends over the surfaces of the second opening and a second portion that extends over a portion of the mask adjacent to the second opening;
- removing the second portion of the second conductive layer; and
- depositing a first metal over the first portion of the second electrically conductive layer.

22. The method of claim 21, wherein patterning the layer stack comprises:
- depositing a layer of photoresist over the layer stack;
- patterning the layer of photoresist so as to form a second mask having an opening therein which exposes a portion of the layer stack; and
- using the second mask to pattern the layer stack.

23. The method of claim 21, wherein using the second mask to pattern the layer stack involves etching the layer stack with a first etch, and wherein using the patterned layer stack as a first mask to etch the substrate involves etching the substrate with a second etch which is distinct from said first etch.

24. The method of claim 22, wherein the first electrically conductive layer and the first and second dielectric layers are coextensive in the patterned layer stack.

25. The method of claim 21, wherein the portion of the second opening which extends into the substrate is coextensive with the first opening.

26. The method of claim 22, wherein the patterned layer of photoresist is removed after the layer stack is patterned but before the patterned layer stack is used as a first mask to etch the substrate.

27. The method of claim 21, wherein the layer stack is formed by:
- depositing a first dielectric material on the substrate, thereby forming the first dielectric layer;
- depositing a first conductive material on the first dielectric layer, thereby forming the first electrically conductive layer; and
- depositing a second dielectric material on the first electrically conductive layer, thereby forming the second dielectric layer.

28. The method of claim 27, wherein the first electrically conductive layer is continuous.

29. The method of claim 27, wherein the first electrically conductive layer is of uniform composition.

30. The method of claim 21, wherein the second electrically conductive layer is in physical contact with the first electrically conductive layer, the first dielectric layer and the second dielectric layer.

31. The method of claim 21, wherein the second electrically conductive layer is in physical contact with the edges of the first electrically conductive layer, the first dielectric layer and the second dielectric layer which are exposed by the first opening.

32. The method of claim 21, wherein the second electrically conductive layer comprises a metal seed layer.

33. The method of claim 32, further comprising forming a barrier layer having a first portion which extends over the surfaces of the second opening and a second portion which extends over a portion of the mask adjacent to the second opening, wherein the barrier layer is in electrical contact with the first electrically conductive layer, and wherein removing the second portion of the second conductive layer includes removing the second portion of the barrier layer.

34. The method of claim 21, wherein removing the second portion of the second conductive layer exposes the second dielectric layer.

35. The method of claim 21, wherein the first metal is deposited over the first portion of the second conductive layer after the second portion of the second conductive layer is removed but before the second dielectric layer is removed.

36. The method of claim 35, wherein the second dielectric layer is removed after the first metal is deposited over the first portion of the second conductive layer.

* * * * *